(12) United States Patent
Motz (10) Patent No.: US 11,515,887 B2
(45) Date of Patent: Nov. 29, 2022

(54) DEVICE COMPRISING A SENSOR, CONTROLLER AND CORRESPONDING METHODS

(71) Applicant: Infineon Technologies AG, Neubiberg (DE)

(72) Inventor: Mario Motz, Wernberg (AT)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 17/210,822

(22) Filed: Mar. 24, 2021

(65) Prior Publication Data
US 2021/0305997 A1   Sep. 30, 2021

(30) Foreign Application Priority Data
Mar. 31, 2020 (DE) .......................... 102020108928.7

(51) Int. Cl.
*H03M 3/00* (2006.01)
*H03M 1/12* (2006.01)
*H03M 7/32* (2006.01)

(52) U.S. Cl.
CPC ......... *H03M 3/506* (2013.01); *H03M 1/1245* (2013.01); *H03M 3/344* (2013.01); *H03M 7/3004* (2013.01)

(58) Field of Classification Search
CPC ..... H03M 3/506; H03M 3/344; H03M 7/3004
USPC ......................................................... 343/143
See application file for complete search history.

(56) References Cited

U.S. PATENT DOCUMENTS

| | | | |
|---|---|---|---|
| 6,140,952 A * | 10/2000 | Gaboury | H03M 3/384 341/143 |
| 6,380,718 B1 * | 4/2002 | Davis, Jr. | H02P 9/30 318/811 |
| 9,742,430 B1 | 8/2017 | Barrenscheen et al. | |
| 10,229,802 B2 | 3/2019 | Reinisch et al. | |
| 2009/0016424 A1 | 1/2009 | Latham et al. | |
| 2011/0102223 A1 * | 5/2011 | Kinyua | H03M 3/344 341/143 |
| 2015/0015427 A1 * | 1/2015 | Maehata | H04B 1/0475 341/118 |

FOREIGN PATENT DOCUMENTS

DE  102017118961 A1  2/2018
DE  102018103653 A1  9/2018

* cited by examiner

*Primary Examiner* — Peguy Jean Pierre
(74) *Attorney, Agent, or Firm* — Harrity & Harrity, LLP (57) ABSTRACT

A device includes a sensor configured to output an analog sensor signal, an analog-to-digital converter circuit configured to convert the analog sensor signal into a sigma-delta-modulated digital signal having a bit width of n bits, and a pulse width modulator configured to generate a pulse-width-modulated signal based on the sigma-delta-modulated digital signal.

20 Claims, 8 Drawing Sheets

DEVICE COMPRISING A SENSOR, CONTROLLER AND CORRESPONDING METHODS

RELATED APPLICATION

This application claims priority to German Patent No. 102020108928.7, filed on Mar. 31, 2020, which is incorporated herein by reference in its entirety.

FIELD

The present application relates to devices comprising a sensor, controllers and corresponding methods. In this case, some embodiments relate to the communication between such a device and a controller by means of pulse-width-modulated signals.

BACKGROUND

Devices comprising a sensor, also referred to hereinafter as sensor devices, are used to detect one physical variable or a plurality of physical variables. Examples thereof are magnetic field sensors, pressure sensors, temperature sensors, current sensors, voltage sensors and the like. In many systems, signals that are representative of the physical variable detected are then transmitted to a controller, which processes further the information thus obtained regarding one or more detected variables. One example thereof is automotive applications, in which data, for example wheel rotational speed, tire pressure, temperatures and the like, are detected by means of a multiplicity of sensors in a vehicle, and then the information thus detected is transmitted from the sensor devices to one or more controllers, often referred to as ECU (Electrical Control Unit).

For this transmission the variables detected by the respective sensor have to be converted into corresponding electrical signals, which are then transmitted. One procedure for doing this is pulse width modulation (PWM), in which signal pulses are transmitted, wherein a duty cycle corresponding to a ratio of a pulse duration to a total cycle length or to a pause length corresponds to a signal value. By way of example, it is possible to use pulses for transmitting 8-bit signals, which can have $2^8-1=255$ different values, which pulses can have 255 different pulse duration lengths, e.g. 1 to 255 time units, depending on the coded value.

For a fixed frequency of an underlying clock signal that defines the time units of the pulse-width-modulated signal, a high resolution results in a low transmission rate, and respectively a low resolution results in a high transmission rate. For example, with a clock signal of 8 MHz, a time unit has a length of 125 ms. A resolution of 14 bits necessitates $2^{14}-1$ clock cycles for one cycle of the pulse-width-modulated signal, which corresponds to a cycle duration of the transmitted information of 2.047 ms. A resolution of 8 bits necessitates $2^8-1$ clock cycles corresponding to a cycle duration of the pulse-width-modulated signal of 232 μs. As frequency, this corresponds to an update rate of approximately 30 kHz instead of approximately 500 Hz in the case of a 14-bit resolution.

In this case, cycle (also referred to as PWM duration) of the pulse-width-modulated signal should be understood to mean substantially that time which is required for a pulse of maximum duration, for example $2^{14}-1$ clock cycles for 14-bit resolution or $2^8-1$ clock cycles for 8-bit resolution. Within a cycle the pulse-width-modulated signal is then in a first state, e.g. high (for example first voltage, first current), for a certain first time duration and in a second state (for example second voltage, second current), e.g. low, for a second time duration and a duty cycle (ratio of the duration of the first state to the duration of a cycle) indicates the value which is coded with the respective pulse. Given a fixed, known cycle duration, the same information is also contained in the duration of the first state, a duration of the second state or a ratio thereof. The duration of the first state (e.g. time in which the signal is at a high level) is also referred to hereinafter as pulse duration.

Some applications, for example for regulating systems, require both a high resolution for accurate regulation and a high update rate, in order to be able to react rapidly to sudden changes in a physical variable detected.

SUMMARY

A device as claimed in claim 1, a controller as claimed in claim 10 and methods as claimed in claims 16 and 22 are provided. The dependent claims define further embodiments.

In accordance with one exemplary embodiment, a device is provided, including a sensor configured to output an analog sensor signal. The device further includes an analog-to-digital converter arrangement configured to convert the analog sensor signal into a sigma-delta-modulated second digital signal having a bit width of n bits, and a pulse width modulator configured to generate a pulse-width-modulated signal based on the second digital signal.

In accordance with a further exemplary embodiment, a controller is provided, including:

an input for receiving a pulse-width-modulated signal from a sensor device, and a processing circuit configured to generate a first digital signal based on averaging over k cycles of the pulse-width-modulated signal, where k is greater than or equal to 2.

In accordance with a further exemplary embodiment, a method is provided, including:

generating a sigma-delta-modulated second digital signal having a bit width of n bits based on an analog sensor signal, and generating a pulse-width-modulated signal based on the second digital signal.

Another method is additionally provided, including:

receiving from a sensor device a pulse-width-modulated signal generated based on a sigma-delta-modulated signal, and generating a first digital signal based on averaging over k cycles of the pulse-width-modulated signal, where k is greater than or equal to 2.

The summary above offers only a brief overview of some embodiments and should not be interpreted as restrictive.

DETAILED DESCRIPTION

Various exemplary embodiments are explained in detail below. They serve for illustration and should not be interpreted as restrictive. In this regard, some exemplary embodiments are described with many features (for example components, elements, processes and the like). In other exemplary embodiments, some of these features can be omitted and/or be replaced by alternative features. Moreover, further features can be provided in addition to the features explicitly described, for example features used in conventional sensor devices and controllers.

Connections or couplings which are described here or are illustrated in the drawings are electrical connections or couplings, unless indicated otherwise. Such connections or couplings can be modified, for example by adding components or omitting components, as long as the basic function of the connection or coupling, for example transmission of a signal, transmission of information or the like, is not significantly influenced.

Features of different exemplary embodiments can be combined with one another, unless indicated otherwise. Variations or modifications that are described for one of the exemplary embodiments are also applicable to other exemplary embodiments and are not described repeatedly.

In the figures, identical elements are designated by the same reference signs and are therefore likewise not repeatedly explained in detail.

Numerical values and signal profiles indicated in the description serve merely for illustration and should not be illustrated as restrictive, since such numerical values and signal profiles can vary depending on the implementation.

Figure 14:
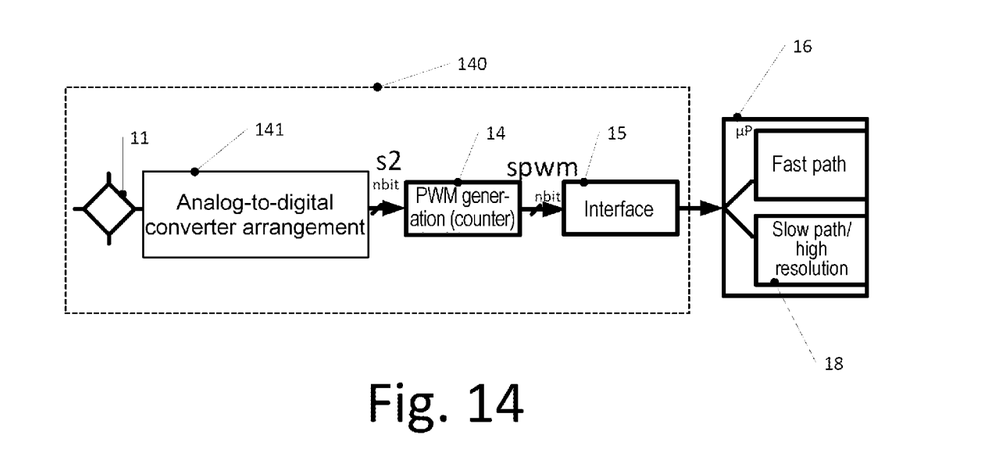
FIG. 14 is a block diagram of a system in accordance with one exemplary embodiment.

FIG. 14 is a block diagram of a device in accordance with one exemplary embodiment. The system in FIG. 14 comprises a sensor device 140 and a controller 16. In some exemplary embodiments, the sensor device 140 can be integrated on a first chip, and the controller 16 can be integrated on a second chip. In other exemplary embodiments, the sensor device 140 can also be embodied with a plurality of chips, which can then be arranged in a respective package, for example.

The sensor device 140 transmits signals to the controller 16 which carry information with regard to a physical variable detected by a sensor 11 of the sensor device 140. Various exemplary embodiments discussed below concern primarily the generation of such signals by a sensor device like the sensor device 140 and the processing thereof in a controller like the controller 16.

The sensor 11 is illustrated as a magnetic field sensor in the form of a Hall sensor in the exemplary embodiment in FIG. 14. This serves merely for illustration, and other types of sensors can also be used. By way of example, it is also possible to use other types of magnetic field sensors such as sensors based on magnetoresistive effects, for example based on giant magnetoresistance (GMR), tunneling magnetoresistance (TMR) or anisotropic magnetoresistance (AMR). Such sensors are also referred to in combination as XMR sensors. Magnetic field sensors are used in vehicle applications, for example, in order to measure rotational speeds by a variable magnetic field being generated as a result of a rotation, said magnetic field then being detected. Different types of sensors than magnetic field sensors can also be used as sensor 11, for example temperature sensors, pressure sensors, current sensors, electrical voltage sensors or sensors for measuring a mechanical stress. Moreover, a plurality of sensors, including sensors of different types, can be provided in the sensor device 10.

The sensor 11 outputs an analog output signal representing the physical variable detected. In the sensor device 140, this analog sensor signal is converted into a sigma-delta-modulated second digital signal s2 having a bit width of n bits by means of an analog-to-digital converter arrangement 141. In this case, n is greater than or equal to 1, for example at least 2, for example 8 or more.

In this case, a sigma-delta-modulated signal should be understood to mean a signal which is generated with the aid of a sigma-delta analog-to-digital converter or a digital sigma-delta modulator and in which a higher resolution than the bit width n is attainable by averaging over time. This has the effect that even with a constant analog sensor signal, the value of the second digital signal s2, in particular of the least significant bit of the second digital signal s2, can vary over time. In this regard, a resolution greater than the value of the least significant bit can be achieved by averaging over time. Examples of the two alternatives of sigma-delta analog-to-digital converter or digital sigma-delta modulator are explained further below.

The second digital signal s2 is fed to a pulse width modulator 14, which substantially comprises a counter. For each period of a pulse-width-modulated signal to be generated, the counter can count up to the value represented by the second digital signal s2, and the pulse width modulator 14 can output a first value. Once the value of the second digital signal s2 is reached, a second value is output for example for a remaining cycle of the pulse-width-modulated signal. The number of first values output thus represents the value of the second digital signal s2. It should be noted that the digital sigma-delta modulator 13 and the pulse width modulator 14 do not have to be implemented as separate units, but rather can be implemented in a common digital circuit, for example by means of a digital signal processor or the like.

A pulse-width-modulated signal generated in this way by sigma-delta modulation can also be referred to as a fractional pulse-width-modulated signal.

The signal spwm output by the pulse width modulator 14 is fed to an interface 15, which generates therefrom a pulse-width-modulated signal on a transmission line. By way of example, the interface 15 can be a voltage interface such as a push-pull interface, an open drain interface or an LVDS (low voltage differential signaling) interface, which outputs a first voltage while the signal spwm is at the first value mentioned above, and outputs a second voltage when the signal spwm is at the second value. The use of a voltage interface here can result in a so-called ratiometric signal, in which the pulse durations are independent of a supply voltage. The amplitude of the pulse-width-modulated signal is proportional to the supply voltage in this case, such that in the event of possible subsequent analog low-pass filtering as explained later, the averaged value from the pulse-width-modulated signal becomes proportional=ratiometric to the supply voltage and is able to be fed to a controller with an analog-to-digital converter input, the reference of which is also proportional to the supply voltage. In other exemplary embodiments, the interface 15 can also be a current interface, as explained in even greater detail later with reference to FIG. 11.

The signal transmitted by the interface 15 is received by the controller 16. The controller 16 can comprise for example a microcontroller, a microprocessor or other processing components in order to evaluate the received signal. In the exemplary embodiment in FIG. 14, the controller 16 here has a fast path 17 and a slow path 18 for evaluating the received signal. In this case, the slow path of high resolution evaluates the received signal over a plurality of cycles (k cycles) of the pulse-width-modulated signal in order to increase the resolution and, given a sufficient number of cycles, ultimately to recover a signal having a resolution of m bits like the first digital signal. Such an evaluation over a plurality of cycles (k cycles) can be effected by averaging over the plurality of cycles (k cycles).

The fast path 17 evaluates fewer cycles (p cycles), for example only one cycle, in order thus to attain a high update rate. Consequently, sudden changes in the physical variable detected by the sensor 11 can be detected by means of the fast path 17, while the slow path 18 offers a high resolution. In this case, it should be noted that a high resolution is generally not required for detecting rapid changes, since rapid changes by large magnitudes are readily detectable even with a low resolution. Examples of evaluation over a plurality of cycles (k cycles) and evaluation over one cycle (p cycle) are likewise explained in even greater detail later.

Figure 15:
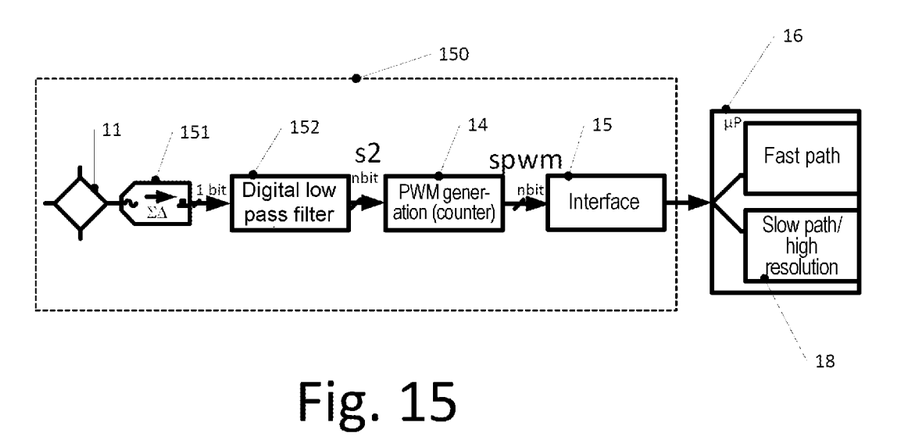
FIG. 15 is a block diagram of a system in accordance with one exemplary embodiment.

FIG. 15 shows one exemplary embodiment of a system with a sensor device 150 with one possible realization of the analog-to-digital converter arrangement 141 from FIG. 14 with a sigma-delta analog-to-digital converter 151 and a digital low-pass filter 152. Apart from that, the system in FIG. 15 corresponds to the system in FIG. 14, and the sensor device 150 corresponds to the sensor device 140, and the remaining components will not be explained again.

The sigma-delta analog-to-digital converter 151 receives the analog sensor signal from the sensor 11 and outputs a 1-bit stream. The sigma-delta analog-to-digital converter 151 can be a first-order or higher-order converter.

The 1-bit stream is filtered by the digital low-pass filter 152 in order to generate the second digital signal s2 having the bit width n. In this case, the filtering is such that n is below a maximum resolution attainable based on the 1-bit stream, for example by means of filtering with a higher cut-off frequency. By means of averaging over a plurality of values of the second digital signal, this maximum resolution could then be achieved (apart from noise effects and the like), such that the second digital signal thus generated is a sigma-delta-modulated signal in the sense above.

Figure 1:
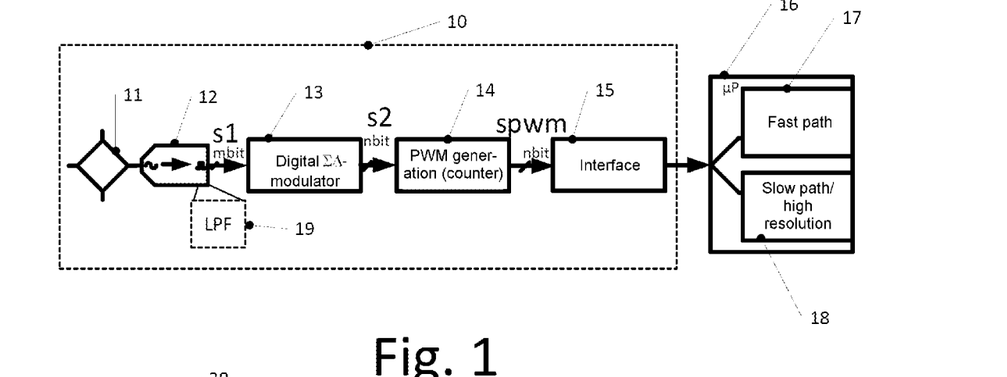
FIG. 1 is a block diagram of a system in accordance with one exemplary embodiment.

FIG. 1 shows one exemplary embodiment of a system with a sensor device 10 with one possible realization of the analog-to-digital converter arrangement 141 from FIG. 14 with an analog-to-digital converter 12 and a digital sigma-delta modulator 13. Apart from that, the system in FIG. 1 corresponds to the system in FIG. 14, and the sensor device 10 corresponds to the sensor device 140, and the remaining components will not be explained again.

In the sensor device 10, the analog sensor signal is converted into a first delta s1 having a bit width of m bits, wherein m is an integer greater than 1, by means of the analog-to-digital converter 12. Typically, m can be between 8 and 16, for example can be equal to 12 or equal to 14. The higher m is, the higher the resolution of the first digital signal output by the analog-to-digital converter 12.

The analog-to-digital converter 12 can directly generate the first digital signal s1 having the bit width of m bits. In other exemplary embodiments, a digital low-pass filter 19 is optionally connected downstream of the analog-to-digital converter 12 at the output thereof, and increases an output of the analog-to-digital converter 12 to a bit width of m bits. By way of example, in such a case, the analog-to-digital converter 12 can be a 1-bit sigma-delta analog-to-digital converter, which generates a 1-bit stream, and the digital low-pass filter 19 can filter this 1-bit stream in order to generate the first digital signal having a bit width of m bits. Any arrangement which generates the first digital signal s1 having a bit width of m bits from the analog sensor signal can generally be used.

The first digital signal s1 is then fed to the digital sigma-delta modulator 13. Based on the first digital signal s1, the digital sigma-delta modulator 13 generates a second digital signal s2 having a bit width of n bits, wherein n is an integer less than m. In this case, a digital sigma-delta modulator is a unit which generates a signal having a bit width of n bits from a signal having a bit width of m bits, wherein at least one feedback signal is subtracted from a signal in a forward signal path of the sigma-delta modulator. Digital sigma-delta modulators of this type are constructed substantially like sigma-delta analog-to-digital converters, wherein a digital input signal is fed in instead of an analog input signal. Examples are explained later. Even if the bit width is reduced from m bits to n bits, the information of the first digital signal s1 is nevertheless still present, in principle, in the second digital signal s2. If a first digital signal s1 is generated with a constant value, an average value of the second digital signal s2 over a plurality of values corresponds to the value represented by the first digital signal s1. This has the effect that in the case of a constant first digital signal s1 which cannot be represented exactly by the second digital signal s2 with n bits, the value of the second digital signal s2 changes even with a constant first digital signal. This will also be explained in even greater detail later based on examples. n can be greater than 6, for example, and a difference between m and n can be between 2 and 12, for example. In an example in which m is 14, n can be equal to 12, equal to 10 or equal to 8, for example. The second digital signal s2 is then processed further as described for FIG. 14.

Figure 2:
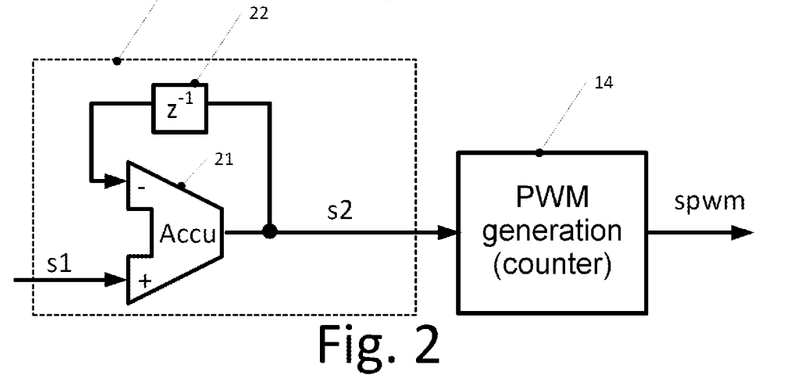
FIG. 2 is a diagram of part of a device in accordance with one exemplary embodiment.

FIG. 2 shows one example of a first-order digital sigma-delta modulator 20 which is usable for example as a digital sigma-delta modulator 13 in the sensor device 10. The digital sigma-delta modulator 20 receives the first digital signal s1 at a positive input of an accumulator 21. The accumulator 21 outputs the second digital signal s2 having the bit width of n bits. In addition, the signal s2 is fed back to a negative input of the accumulator 21 with a delay 22 by one clock cycle. Consequently, the signal s2 output by the accumulator 21 increases or decreases by a difference between the signal s1 and the signal s2 of a preceding clock period. Generally, the accumulator 21 modifies the signal output by it according to a difference between its input signals. The second digital signal s2 is then fed to the pulse width modulator 14 already discussed. As will be explained later, higher-order sigma-delta modulators are also usable, however.

Next the generation of a pulse-width-modulated signal and the evaluation thereof in a controller will be explained in even greater detail with reference to FIGS. 3 and 4.

Figure 3:
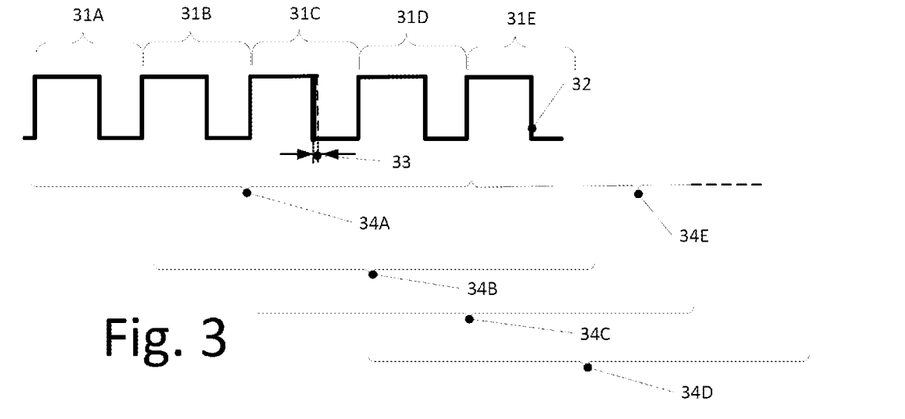
FIG. 3 shows exemplary signals for elucidating exemplary embodiments.

FIG. 3 shows one example of a pulse-width-modulated signal 32 such as can for example be generated by the pulse width modulator 14 from FIGS. 1 and 2 and then be output by the interface 15 from FIG. 1. In the example in FIG. 3, four cycles 31A-31D of the pulse-width-modulated signal 32 are illustrated in full and a fifth cycle 31E is illustrated in part.

Figure 4:
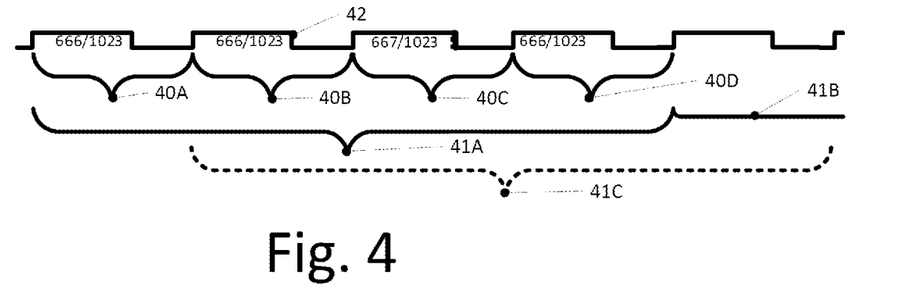
FIG. 4 shows further exemplary signals for elucidating exemplary embodiments.

In the example in FIG. 3 and also in the subsequent example in FIG. 4, it is assumed that in this case the signal s1 fed to a digital sigma-delta modulator like the sigma-delta modulator 13 from FIG. 1 or the sigma-delta modulator 20 from FIG. 2 is constant.

In this case, the n-1 most significant bits of the second digital signal s2 correspond to the n-1 most significant bits of the first digital signal s1, wherein, if the m-n least significant bits of the first signal s1 are different than zero, the least significant bit of the second digital signal s2 is variable over time even with a constant first digital signal s1, such that the value of the second digital signal s2 corresponds on average to the value of the first digital signal s1.

In order to illustrate this effect, in the example in FIGS. 3 and 4 it is assumed that the m-n least significant bits of the first digital signal s1 are different than zero.

In the pulse-width-modulated signal 32, a pulse duration during which the pulse-width-modulated signal 32 is at a high level represents a respective value of the second digital signal s2. Since the m-n least significant bits of the first digital signal s1 are different than zero, this pulse duration here is not constant even when a constant first digital signal s1. This is illustrated in FIG. 3 in the cycle 31C, where the pulse duration is increased by a time duration 33.

The value of the first digital signal s1 can then be reconstructed by averaging over a number of cycles, as indicated by a bracket 34A in FIG. 3. In this case, the number of cycles over which averaging has to be effected in order to reconstruct the value of the first digital signal s1 exactly (assuming a constant first digital signal s1) depends on the difference between m and n. The greater this difference, the more cycles over which averaging has to be effected. In concrete terms, averaging over $2^{m-n}$ cycles is required for this. However, averaging over fewer cycles is also possible.

This averaging is carried out in a controller, for example in the slow path 18 of the controller 16 from FIG. 1. In some exemplary embodiments, the averaging can be effected successively, such that after the four cycles 34A a next average value is effected over the following four cycles, as indicated by a bracket 34E. In other exemplary embodiments, the averaging can be effected in a moving fashion, as indicated by brackets 34B to 34D. In this case, the use of moving averaging has the advantage of a higher update rate corresponding to the inverse of the duration of a cycle 31A to 31E. By means of the averaging, inherent low-pass filtering is nevertheless effected in this case, such that sudden changes in the first digital signal s1 are only gradually reflected in the value determined by the averaging. Such averaging can be effected in the controller 16 by digital filtering, for example by means of an infinite impulse response (IIR) filter, a finite impulse response (FIR) filter, a cascaded integrator-differentiator filter (CIC filter) or a low-pass filter in which the edge steepness is adapted to the averaging desired.

In order to be able to rapidly register sudden changes in the output signal of the sensor and thus in the first digital signal s1, an evaluation of individual cycles 31A to 31E is therefore performed in the fast path 17 of the controller 16. Alternatively, averaging can also be effected over fewer cycles than in the slow path 18, for example over two cycles in the example in FIG. 3.

FIG. 4 shows a pulse-width-modulated signal 42 similar to the pulse-width-modulated signal 32 from FIG. 3, with a plurality of cycles 40A, 40B, 40C, 40D (k cycles). In the example in FIG. 4, the second digital signal s2 is a 10-bit signal, with $2^{10}=1024$ different pulse durations, from 0 to 1023 time units. Furthermore, in the example in FIG. 4, the first digital signal s1 is a 12-bit signal, such that m-n=2.

In this example, averaging over $2^{12-10}=4$ cycles is accordingly required in order to correctly reconstruct the value of the first digital signal s1.

In the example in FIG. 4, the least significant two bits of the first digital signal have the value 01, for example. This has the effect that in the case of four successive cycles of the pulse-width-modulated signal 42, in one cycle the pulse duration is lengthened by one unit. In the example in FIG. 4, the pulses in the cycles 40A, 40B and 40D have a length of 666 time units (of a maximum of 1023 time units), while the pulse in the cycle 40c has a duration of 667 time units. The first digital signal s1 can then be reconstructed by averaging over the four cycles 40A to 40D. On the other hand, as explained, changes in the physical variable detected by the sensor and thus in the first digital signal s1 can be detected rapidly by the evaluation of individual cycles.

As already explained with reference to FIG. 3, the averaging can be effected here "block by block" in each case over four successive cycles, as indicated by a bracket 41B, or by moving averaging, as indicated by a bracket 41C.

Figure 5:
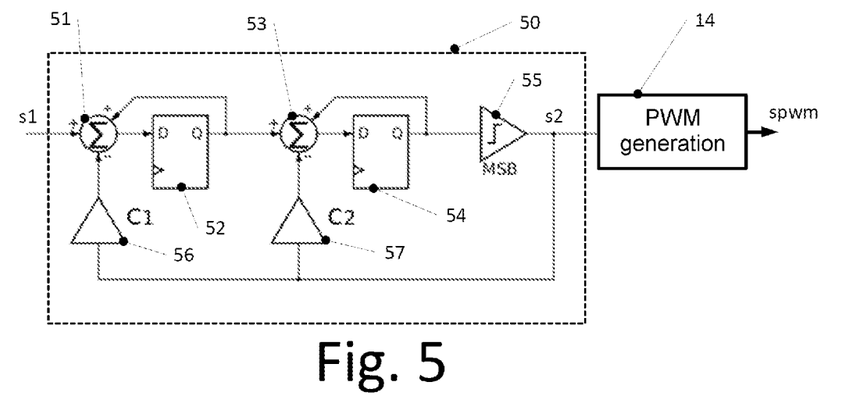
FIG. 5 shows part of a device in accordance with one exemplary embodiment.

One example of a first-order sigma-delta modulator was illustrated in FIG. 2. However, sigma-delta modulators of a different, in particular higher, order can also be used. One example of a second-order sigma-delta modulator 50 is illustrated in FIG. 5. It should be noted that, although the sigma-delta modulator 50 is illustrated with discrete components, the latter can be implemented by means of a digital signal processor or some other suitable digital circuit, for example.

The sigma-delta modulator 50 receives the first digital signal s1 at a first positive input of a subtractor 51. An output of the first subtractor 51 is fed to a data input D of a first digital storage unit 52 having a width of at least m bits, symbolized here as D-type flip-flops. Such a storage unit can be realized by a plurality of, e.g. at least m, D-type flip-flops. Other storage units can also be used, such as RAM memories.

A data output Q of the first digital storage unit 42 is fed back to a second positive input of the first subtractor and is additionally connected to a first positive input of a second subtractor 53. An output of the second subtractor 53 is connected to a data input D of a second digital storage unit 54 (again symbolized as a D-type flip-flop; the explanations concerning the first digital storage unit 52 are correspondingly applicable here). A data output Q of the second digital storage unit 54 is fed back to a second positive input of the second subtractor 53. At their respective data output Q the digital storage units 52, 54 in each case output the signal present at their data input D, in a manner controlled by a clock signal (not illustrated) present at their clock input.

The data output Q of the second digital storage unit 54 is fed to a truncator 55, which outputs the m most significant bits of the signal fed to it as signal s2. The signal s2 is then weighted with a first weighting factor C1 in a multiplier 56 and fed to a negative input of the first subtractor 41, and is weighted with a second weighting factor C2 in a multiplier 57 and fed to a negative input of the second subtractor 53.

The signal s2 is then additionally fed to the pulse width modulator 14 already discussed.

In one exemplary embodiment, for the sigma-delta modulator 50 the bit width n of the first digital signal s1 can be equal to 14 and the bit width of the second digital signal s2 can be equal to 8. Other values are likewise possible, wherein the bit width of the second digital signal s2 is set by way of how many bits are truncated by the truncator 55.

The signal-to-noise ratio SNR in the case of such a procedure is $$SNR \approx 20\log\left[2^B \sqrt{1.5\pi} \cdot \sqrt{2L+1} \cdot \left(\frac{OR}{\pi}\right)^{(2L+1)/2}\right] dB$$

In this case, OR is an oversampling rate, B is a bit width of the signal s2, and L is the order of the sigma-delta modulator. In the above example where n=14 and m=8, an 8-bit PWM signal with an update rate of 30 kHz can be generated with the sigma-delta modulator 50, for example. By means of averaging at a receiver, for example the controller 16, it is possible to generate a high-resolution 14-bit signal with an update rate of approximately 2.7 kHz with a first-order sigma-delta modulator, and with an update rate of approximately 7.5 kHz in the case of a second-order sigma-delta modulator. The greater update rate for a higher order is owing to the fact that variations of the pulse duration (e.g. 33 in FIG. 3) are distributed over the signal better in the case of a higher-order modulator.

In some exemplary embodiments, an analog-to-digital converter used for analog-to-digital conversion of the sensor signal (for example the analog-to-digital converter 12) can be provided with a chopper arrangement in order to minimize an offset of the analog-to-digital converter. A chopper signal used for this can be synchronized with the cycles of the pulse-width-modulated signal. One example thereof is explained with reference to FIGS. 6 and 7.

Figure 6:
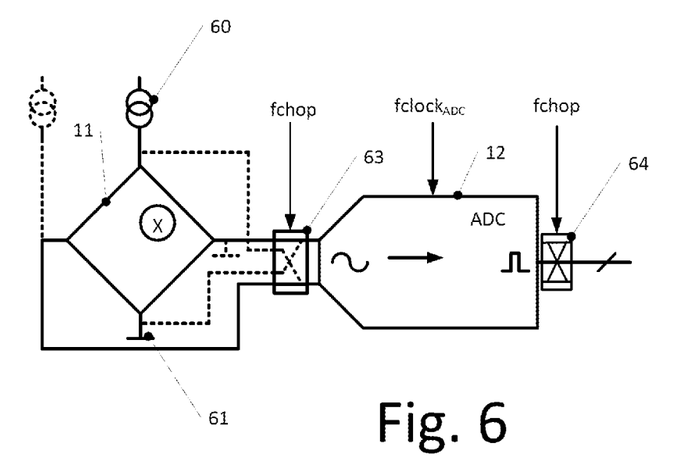
FIG. 6 illustrates the use of chopping in accordance with some exemplary embodiments.

FIG. 6 shows the sensor 11 and the analog-to-digital converter 12 of the exemplary embodiment from FIG. 1. As already mentioned with reference to FIG. 1, the sensor 11 is a Hall sensor in the example illustrated. In the example in FIG. 6, the sensor 11 is operated using a so-called spinning current technique. In this case, a bias current from a current source 60 is fed to the Hall sensor 11 at one terminal, while an opposite terminal is connected to ground 61. A Hall voltage is then tapped off at two further terminals. In the spinning current technique, as indicated by dashed lines in FIG. 6, the terminals used for feeding in the bias current and the terminals used for tapping off the Hall voltage are then interchanged, which can reduce offsets of the sensor 11. Since this is a technique known per se, this will not be explained in greater detail. As already mentioned with reference to FIG. 1, other types of sensors can also be used, however.

A first chopper arrangement 63 is provided at the input of the analog-to-digital converter 12, and a second chopper arrangement 64 is provided at an output of the analog-to-digital converter 12. The chopper arrangements 63, 64 are each operated with a chopper frequency fchop. The analog-to-digital converter 12 is operated with a frequency $fclock_{ADC}$. The chopping itself—apart from the synchronization with the pulse-width-modulated signal explained below—can be implemented in any conventional way and serves to at least partly compensate for an offset of the analog-to-digital converter 12.

Figure 7:
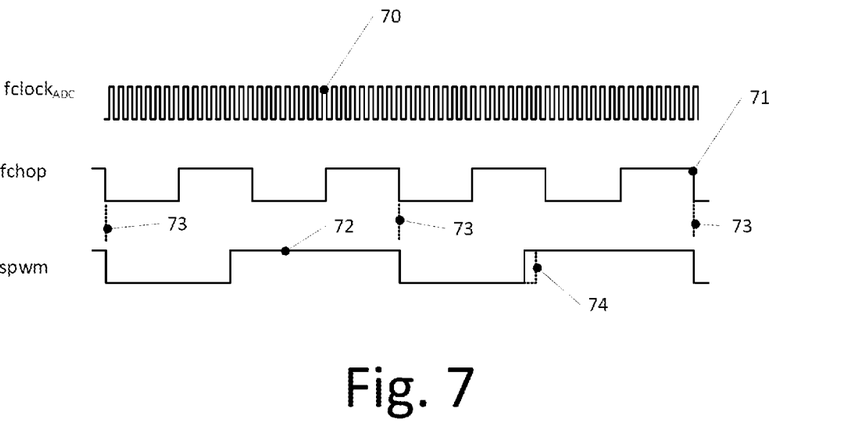
FIG. 7 shows signals for elucidating some exemplary embodiments.

In FIG. 7, a curve 70 shows one example of the clock signal $fclock_{ADC}$, a curve 71 shows one example of the chopper frequency fchop, and a curve 72 shows one example of the pulse-width-modulated signal spwm, which, as explained and as indicated at 74, can have variable pulse durations even with a constant signal s1. In the exemplary embodiment in FIGS. 6 and 7, the chopper frequency fchop and the pulse-width-modulated signal spwm are synchronized in such a way that in each cycle of the pulse-width-modulated signal in accordance with the curve 72 there is an integral number of periods of the chopper frequency fchop and the beginning and end of a cycle of the pulse-width-modulated signal in accordance with curve 72 coincide with edges, in the example in FIG. 7 falling edges, of the chopper frequency fchop, as is indicated by dashed lines 73. This synchronization of the chopper frequency fchop and the pulse-width-modulated signal spwm makes it possible to suppress so-called intermodulation effects, i.e. interference signals in which the chopper ripple (positive or negative offset with the frequency fchop) could generate beat effects in the signal spwm. In other exemplary embodiments, however, the chopping can also be omitted or not synchronized with the pulse-width-modulated signal spwm.

In the exemplary embodiments discussed above, the averaging is effected in the controller 16, for example in a digital part of the controller 16. In other exemplary embodiments, analog low-pass filtering can be effected for the purpose of averaging. A corresponding exemplary embodiment is illustrated in FIG. 8.

Figure 8:
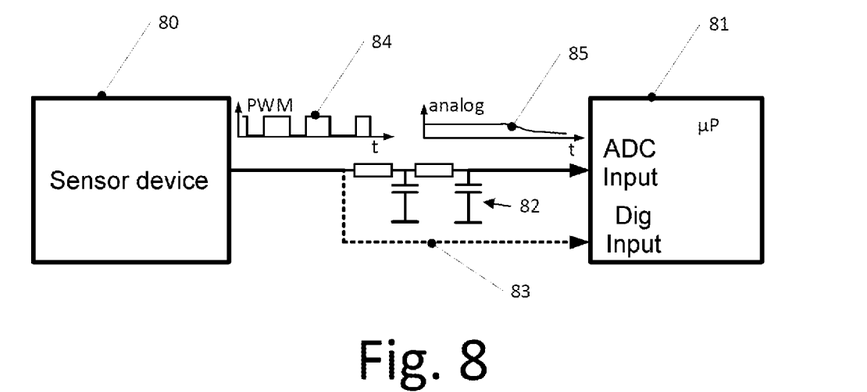
FIG. 8 shows a diagram of a system in accordance with one exemplary embodiment.

FIG. 8 shows a system with a sensor device 80 and a controller 81. The sensor device 80 outputs a pulse-width-modulated signal 84 in the manner described above, i.e. a pulse-width-modulated signal based on an output signal of a sigma-delta modulator used to reduce a bit width.

One example of such a pulse-width-modulated signal is illustrated in a curve 84 in FIG. 8.

In the case of a signal 84, the pulse duration decreases toward the end of the time segment illustrated, which can correspond for example to a lower value of the physical variable detected by the sensor device 80.

The pulse-width-modulated signal 84 is fed to an analog low-pass filter 82. In the example in FIG. 8, the low-pass filter 82 has two resistors and two capacitors. This is only one example, however, and other implementations of low-pass filters are also possible.

In this way, an analog signal arises in which as it were an average is formed over a plurality of cycles (k cycles) of the pulse-width-modulated signal by means of the low-pass filtering. One example of such an analog signal is shown by a curve 85, which matches the curve 84, i.e. when the pulse duration decreases, the analog signal 85 falls, wherein a comparatively slow fall (depending on the time constant of the low-pass filter) is present on account of the low-pass filtering. This signal is then fed to an analog-to-digital converter input of the controller 81 and processed further. By means of the low-pass filtering of the pulse-width-modulated signal 84, the resolution is increased in this case—in a manner corresponding to the averaging discussed above.

In addition, the pulse-width-modulated signal, as indicated by a dashed part 83, can optionally be fed to a digital input of the controller 81, for example in order to evaluate individual cycles (p cycles) of the pulse-width-modulated signal and thus to form a fast path like the fast path 17 from FIG. 1, in which in particular great changes can be detected more rapidly than is possible by way of the low-pass-filtered analog signal on account of the time constant of the low-pass filter.

In the exemplary embodiments described above, a physical variable is detected by a sensor and the detected variable is ultimately transmitted in a manner coded by pulse width modulation. In some exemplary embodiments, further information can be transmitted on this pulse-width-modulated signal by means of pulse code modulation. Such further information can be for example a further physical variable detected by a further sensor device. One example thereof will now be explained with reference to FIGS. 9 and 10.

Figure 9:
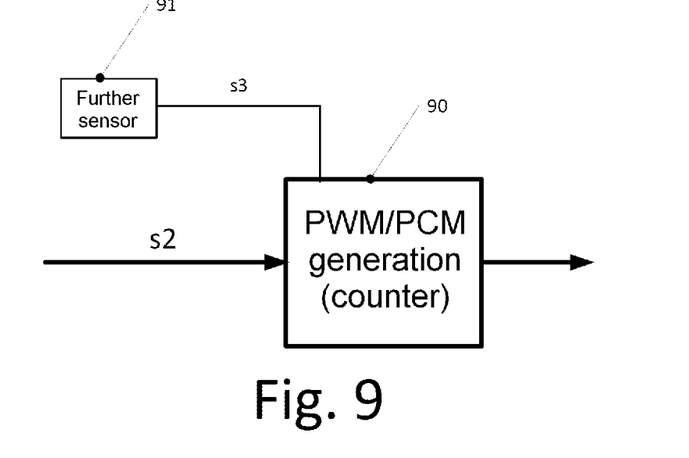
FIG. 9 is a block diagram of part of some exemplary embodiments.

FIG. 9 is a block diagram of part of a sensor device in accordance with one exemplary embodiment. In this case, the second digital signal s2 already discussed is fed to a pulse width/pulse code modulator 90, said second digital signal being generated from a first digital signal by means of a sigma-delta modulation as explained above. In addition, a further sensor unit 91 generates a further physical variable and provides a corresponding digital signal s3. The further physical variable can be a different physical variable than the physical variable otherwise detected by the sensor device for example by means of the sensor 11 discussed. By way of example, the further physical variable can be the temperature. In other exemplary embodiments, the further physical variable can be the same physical variable as the physical variable otherwise detected by the sensor device, in order to provide a redundancy. Besides a further sensor, the further sensor unit 91 can also comprise a further analog-to-digital converter, for example, such that the third signal s3 can be a digital signal.

Based on the second digital signal s2, the pulse width/pulse code modulator 90 generates a pulse-width-modulated signal substantially as described above. In contrast to the exemplary embodiments above, however, now a duration of the cycles of the pulse-width-modulated signal is additionally varied in the form of a pulse code modulation based on the third digital signal s3. By way of example, a first cycle length can mean a logic zero and a second cycle length can mean a logic one for the coding of the third signal s3, such that a four-bit value can be transmitted for example over four cycles.

Figure 10:
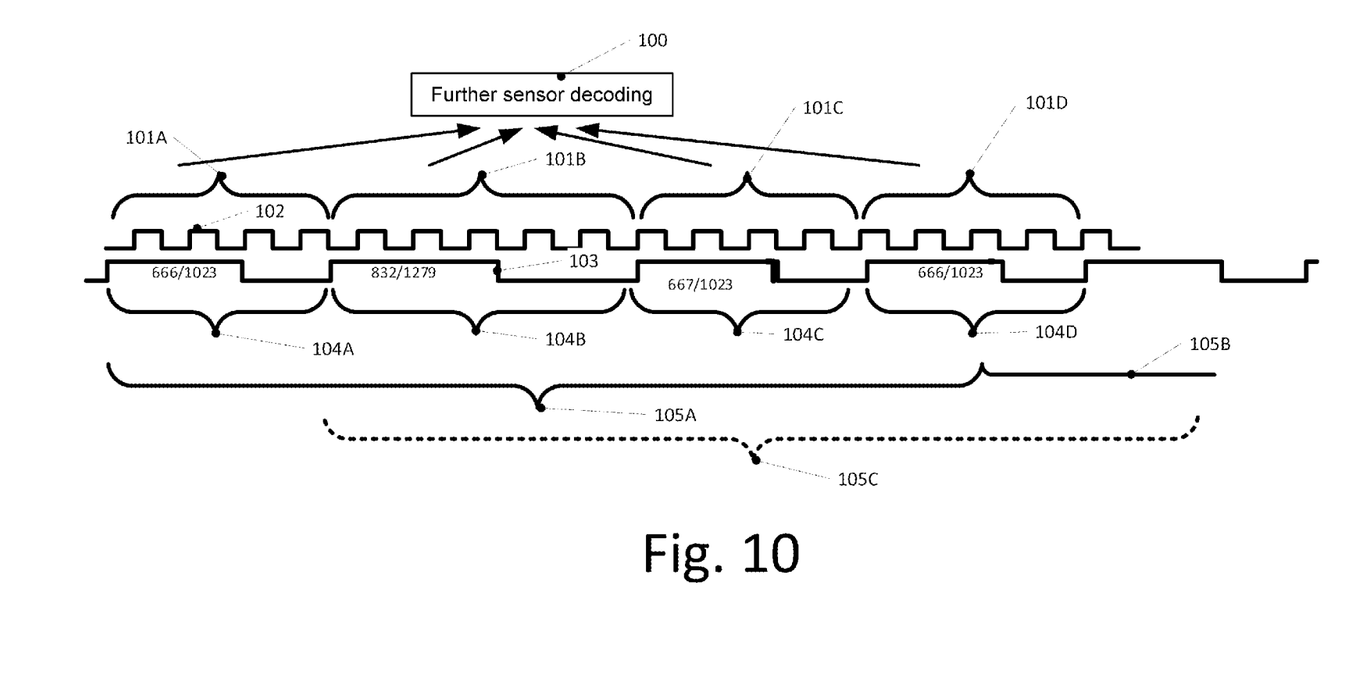
FIG. 10 shows exemplary signals for elucidating the exemplary embodiments from FIG. 9.

One example of such a combined pulse width modulation and pulse code modulation is shown in FIG. 10. As in the illustration in FIGS. 3 and 4, a constant first digital signal s1 is assumed here, wherein said first digital signal s1, for illustration purposes, has the same value as in the example in FIG. 4.

FIG. 10 shows a combined pulse-width-modulated/pulse-code-modulated signal 103 over four cycles 104A to 104D. In the cycles 104A, 140C and 104D, the length of each cycle is 1023 time units as in the example in FIG. 4, wherein once again in a manner corresponding to FIG. 4 a pulse length is 666 time units in the cycles 104A and 104B (corresponding to the cycles 40A and 40B in FIG. 4) and 667 time units in the case of the cycle 104C (as in the cycle 40C in FIG. 4). The length of the cycle 104B is 1279 time units, and the pulse duration is 832 time units, which substantially (within the scope of the accuracy governed by the number of time units) codes the same value as the pulses in the cycles 104A and 104D (and the cycle 40B in FIG. 4).

The pulse-width-modulated signal can thus be decoded as already described. In other words, as indicated by a bracket 105A, it is possible to form an average value over a plurality of cycles, four cycles in that case. This can be done repeatedly in succession, as indicated by a bracket 105B, or by means of moving averaging, as indicated by a dashed bracket 105C, and as has likewise already been explained above. In addition, in a controller that receives the signal 103 (for example the controller 16 from FIG. 1 or the controller 81 from FIG. 8), the signals are evaluated in a second sensor decoding 100. Said second sensor decoding 100 can be implemented by corresponding programming of digital signal processing of the respective controller. The durations of the cycles are evaluated here, as indicated by brackets 101A to 101D. In this case, for example, a duration of 1023 time units can represent a logic zero and a duration of 1279 time units can represent a logic one, such that over four cycles a value "0100" is transmitted in the example illustrated. More or fewer cycles can also be used, depending on the required resolution of the transmission of the third signal s3. In this case, a greater number of cycles corresponds to a higher resolution with at the same time a lower transmission rate.

Alternatively, or additionally, a certain range of pulse durations can be provided for transmitting additional information, e.g. status information. Such ranges can be in the range of short and/or pulse durations. In this regard, a duration of a cycle for a 10-bit signal can comprise e.g. 1123 time units, rather than 1023 time units. Pulse durations of between 50 and 1073 time units are used for the regular transmission of the signal s2 as described above. A pulse duration of between 0 and 49 time units can indicate e.g. a first type of error, and a pulse duration of between 1074 and 1123 time units can indicate a second type of error.

As explained with reference to FIG. 1, different types of interfaces 15 can be used, in particular different types of voltage interfaces, in which the pulse-width-modulated signal uses two different voltages, for example. As likewise already mentioned, a current interface can also be used. One example of a current interface is illustrated in FIG. 11.

Figure 11:
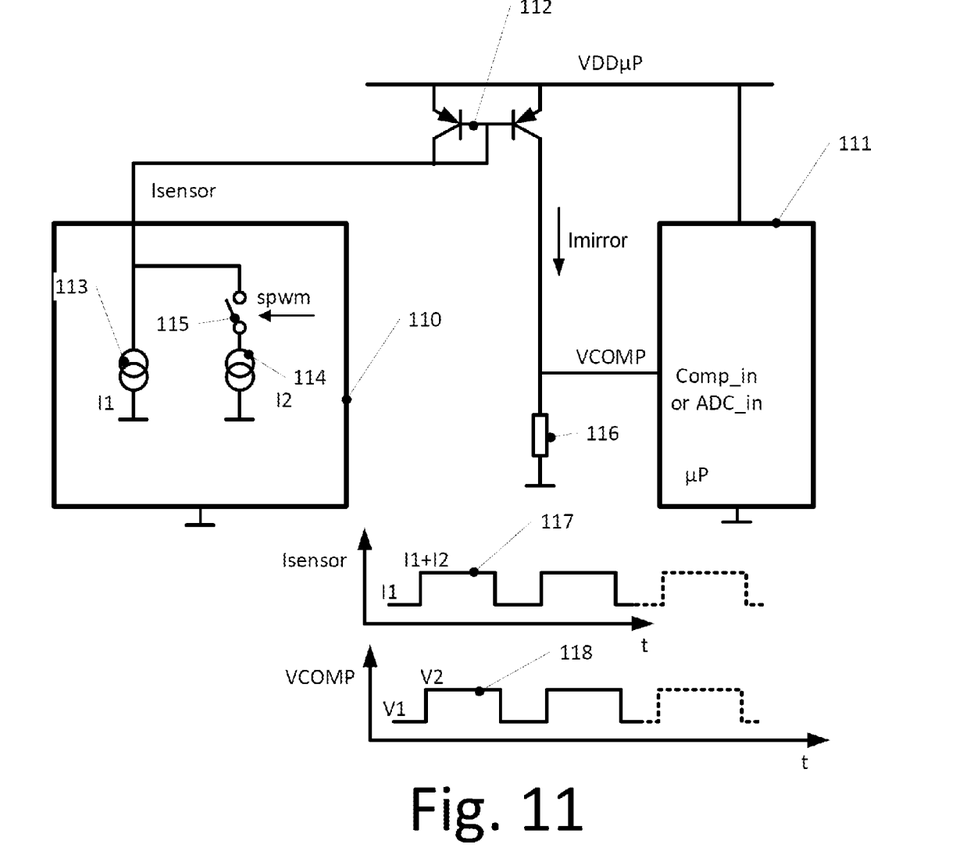
FIG. 11 shows a system with a current interface in accordance with some exemplary embodiments.

The system in FIG. 11 comprises a sensor device 110 having a current interface comprising a first current source 113, a second current source 114 and a switch 115. The switch 115 is controlled by the signal spwm generated by a pulse width modulator such as the pulse width modulator 14 from the exemplary embodiments described above. The sensor device accordingly outputs a current $I_{Sensor}$, that varies between a first current level I1 and a second current level I1+I2. One example of such a current $I_{Sensor}$ over time t is shown by a curve 117 in FIG. 11.

By way of a current mirror 112 supplied with a supply voltage VDDμR of a controller 111, the current $I_{Sensor}$ is mirrored to form a current $I_{Mirror}$, which correspondingly has two different current levels, and is fed to a resistor 116, across which a voltage VCOMP is dropped. As shown as an example by means of a curve 118 in FIG. 11, the voltage VCOMP then varies between two voltage values V1 and V2 and can then be fed to the controller 111 and be processed there as already discussed.

Figure 12:
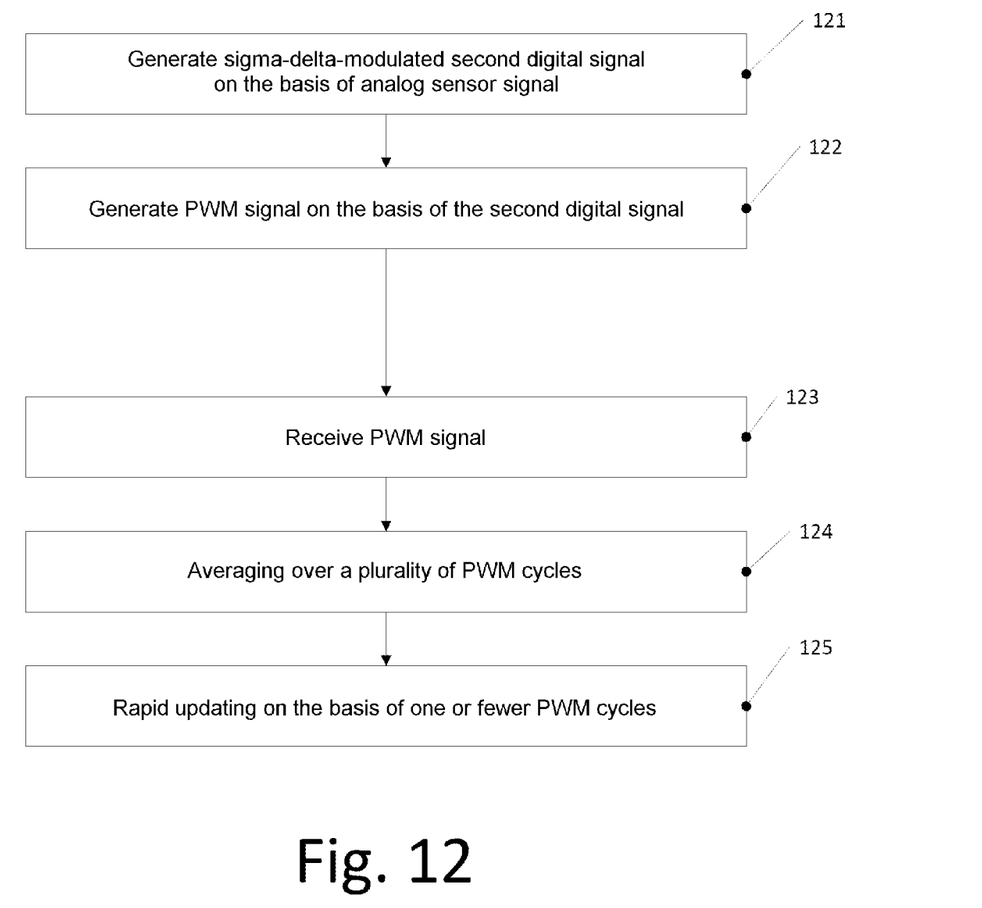
FIG. 12 shows a flow diagram for illustrating methods in accordance with some exemplary embodiments.

FIG. 12 shows a method in accordance with one exemplary embodiment. The method in FIG. 12 can be implemented by means of the systems and devices discussed above and is described with reference thereto in order to avoid repetitions. Various variants described above, for example the additional use of a pulse code modulation, are also applicable to the method in FIG. 12. However, the method in FIG. 12 is also able to be carried out using devices other than those described.

At 121, the method comprises generating a sigma-delta-modulated second digital signal based on an analog sensor signal. One example thereof is the generation of the second digital signal s2 as described above. In this regard, the generation can be effected by means of an analog sigma-delta analog-to-digital conversion followed by a digital low-pass filtering as in FIG. 15 or by means of an analog-to-digital conversion followed by a digital sigma-delta modulation as in FIG. 1.

At 122, the method comprises generating a pulse-width-modulated signal based on the second digital signal as described above.

The pulse-width-modulated signal can then be transmitted from a sensor device to a controller, for example. At 123, the pulse-width-modulated signal is then received, for example in the controller. At 124, averaging over a plurality of cycles (k cycles) of the pulse-width-modulated signal is carried out in order to obtain information with a high resolution, as described above. In addition, at 125, rapid updating of a received signal can be effected based on one or fewer cycles (p cycles), in a manner corresponding to the fast path 17 in FIG. 1, for example.

Such a method thus makes it possible both to effect fast updating of a variable detected by a sensor device in a controller (at 125) and to obtain the detected variable in a high resolution (by means of the averaging at 124).

Figure 13:
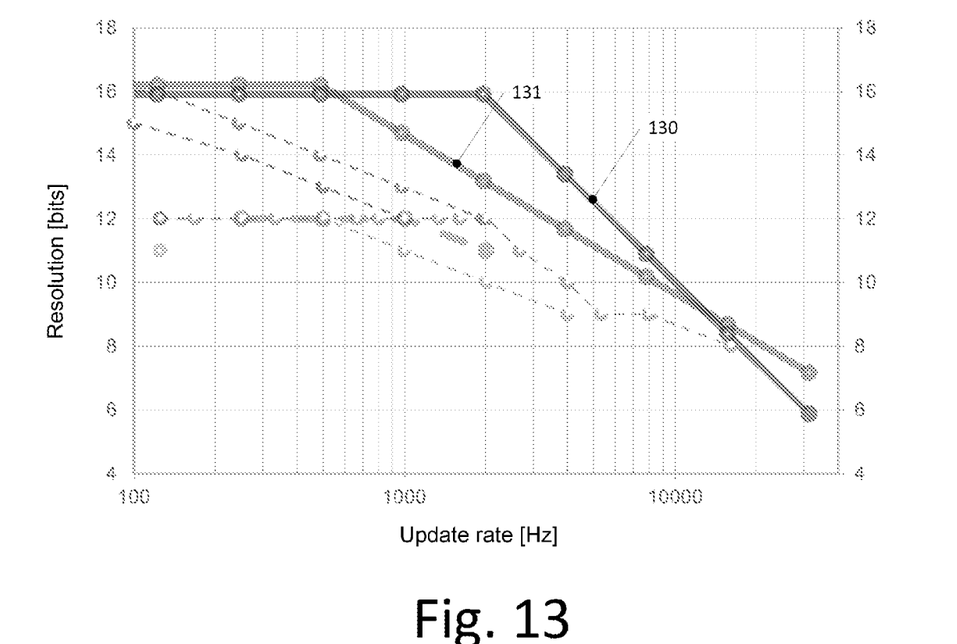
FIG. 13 shows simulation results for comparing some exemplary embodiments with conventional procedures.

For further illustration, FIG. 13 shows simulation results for various exemplary embodiments and comparative examples. In this case, in FIG. 13, an attainable resolution is plotted against an attainable update rate in hertz. A curve 130 shows the behavior with an exemplary embodiment which uses a second-order sigma-delta modulator, while curve 131 shows the behavior for an exemplary embodiment which uses a first-order sigma-delta modulator. In both cases, a high resolution and a high update rate can be provided simultaneously through the use of a slow path, which uses averaging of k cycles, and a fast path based on p cycle(s), as explained. Dashed lines show a plurality of conventional procedures. Here over a wide range it is not possible to obtain a high update rate with high resolution at the same time, and a corresponding system has to be reprogrammed between high resolution corresponding to longer PWM cycles and high update rate corresponding to shorter PWM cycles.

Some exemplary embodiments are defined by the following examples:

Example 1. A device, comprising:
a sensor configured to output an analog sensor signal,
an analog-to-digital converter arrangement configured to convert the analog sensor signal into a sigma-delta-modulated second digital signal having a bit width of n bits, and a pulse width modulator configured to generate a pulse-width-modulated signal based on the second digital signal.

Example 2. The device according to Example 1, wherein n is greater than 6.

Example 3. The device according to Example 1 or 2, wherein the analog-to-digital converter arrangement comprises a sigma-delta analog-to-digital converter for generating a bit stream and a low-pass filter for generating the second digital signal based on the bit stream, wherein n is less than a resolution achievable based on the bit stream.

Example 4. The device according to Example 1 or 2, wherein the analog-to-digital converter arrangement comprises an analog-to-digital converter configured to convert the analog sensor signal into a first digital signal having a bit width of m bits, and
a digital sigma-delta modulator configured to generate the second digital signal having the bit width of n bits where n<m based on the first digital signal.

Example 5. The device according to Example 4, wherein m is greater than or equal to 10.

Example 6. The device according to Example 4 or 5, wherein m-n is between 2 and 12.

Example 7. The device according to any of Examples 4 to 6, wherein the analog-to-digital converter comprises a low-pass filter at its output in order to increase the bit width of the first signal from a previous bit width to m.

Example 8. The device according to any of Examples 4 to 7, wherein the sigma-delta modulator is an nth-order modulator, n>=1.

Example 9. The device according to any of Examples 1 to 8, wherein the pulse width modulator comprises a counter.

Example 10. The device according to any of Examples 1 to 9, further comprising an interface for outputting the pulse-width-modulated signal (spwm).

Example 11. The device according to Example 10, wherein the interface comprises a push-pull interface.

Example 12. The device according to Example 10, wherein the interface comprises an open drain interface.

Example 13. The device according to Example 10, wherein the interface comprises a low voltage differential signaling interface.

Example 14. The device according to Example 10, wherein the interface comprises a current interface.

Example 15. The device according to any of Examples 10 to 14, further comprising an analog low-pass filter coupled to an output of the interface.

Example 16. The device according to any of Examples 1 to 15, further comprising a further sensor unit for outputting a third signal, wherein the pulse width modulator is configured to modulate the pulse-width-modulated signal based on the third signal as pulse code.

Example 17. The device according to any of Examples 1 to 16, wherein the pulse width modulator is configured to generate the pulse-width-modulated signal with pulse durations in a first range based on the second digital signal, and to generate the pulse-width-modulated signal with pulse durations in a second range, which is different than the first range, based on further information.

Example 18. The device according to Example 17, wherein the further information comprises status information.

Example 19. The device according to any of Examples 1 to 18, wherein the analog-to-digital converter arrangement has a chopper arrangement, which operates with a chopper frequency, wherein a cycle of the pulse-width-modulated signal contains an integral number of periods of the chopper frequency.

Example 20. A controller, comprising:
an input for receiving a pulse-width-modulated signal from a sensor device, and
a processing circuit configured to generate a first digital reception signal based on averaging over k cycles of the pulse-width-modulated signal, where k is greater than or equal to 2.

Example 21. The controller according to Example 20, wherein the processing circuit is further configured to generate signal values of a second digital reception signal based on in each case p cycles of the pulse-width-modulated signal, wherein p is less than k.

Example 22. The controller according to Example 21, wherein p is equal to 1.

Example 23. The controller according to any of Examples 20 to 22, wherein k is greater than or equal to 4.

Example 24. The controller according to any of Examples 20 to 23, wherein the averaging comprises moving averaging.

Example 25. The controller according to any of Examples 20 to 24, wherein the processing circuit comprises for averaging an FIR filter, an IIR filter, a CIC filter or a digital low-pass filter.

Example 26. The controller according to any of Examples 20 to 25, wherein the processing circuit is configured to obtain pulse-code-modulated information from a modulated pulse duration of the pulse-width-modulated signal.

Example 27. A system, comprising:
a device according to any of Examples 1 to 19, and
a controller according to any of Examples 20 to 26 coupled to the device.

Example 28. A method, comprising:
generating a sigma-delta-modulated second digital signal having a bit width of n bits based on an analog sensor signal, and
generating a pulse-width-modulated signal based on the second digital signal.

Example 29. The method according to Example 28, wherein n is greater than 6.

Example 30. The method according to Example 28 or 29, wherein generating the second digital signal comprises sigma-delta analog-to-digital conversion of the analog sensor signal in order to generate a bit stream, and low-pass filtering of the bit stream in order to generate the second digital signal having the bit width of n bits, wherein n is less than a resolution achievable based on the bit stream.

Example 31. The method according to Example 28 or 29, wherein generating the second digital signal comprises converting the analog sensor signal into a first digital signal having a bit width of m bits and
digital sigma-delta modulation of the first digital signal in order to generate the second digital signal having the bit width of n bits where n<m.

Example 32. The method according to Example 31, wherein m is greater than or equal to 10.

Example 33. The method according to Example 31 or 32, wherein m-n is between 2 and 12.

Example 34. The method according to any of Examples 28 to 33, further comprising outputting the pulse-width-modulated signal.

Example 35. The method according to Example 34, wherein the outputting comprises outputting via a push-pull interface, an open drain interface or a low voltage differential signaling interface.

Example 36. The method according to Example 34, wherein the outputting comprises outputting via a current interface.

Example 37. The method according to any of Examples 34 to 36, further comprising analog low-pass filtering of the pulse-width-modulated signal that is output.

Example 38. Method according to any of Examples 28 to 37, further comprising pulse code modulation of the pulse duration of the pulse-width-modulated signal based on a further sensor signal.

Example 39. Method according to any of Examples 28 to 37, wherein the pulse-width-modulated signal is generated with pulse durations in a first range based on the second digital signal, and wherein the pulse-width-modulated signal is generated with pulse durations in a second range, which is different than the first range, based on further information.

Example 40. Method according to any of Examples 28 to 39, wherein generating the sigma-delta-modulated second digital signal comprises chopping with a chopper frequency, wherein a cycle of the pulse-width-modulated signal contains an integral number of periods of the chopper frequency.

Example 41. A method, comprising:
receiving from a sensor device a pulse-width-modulated signal generated based on a sigma-delta-modulated signal, and
generating a first digital signal based on averaging over k cycles of the pulse-width-modulated signal, where k is greater than or equal to 2.

Example 42. The method according to Example 41, further comprising:
generating signal values of a second digital signal based on in each case p cycles of the pulse-width-modulated signal, wherein p is less than k.

Example 43. The method according to Example 42, wherein p is equal to 1.

Example 44. The method according to any of Examples 41 to 43, wherein k is greater than or equal to 4.

Example 45. The method according to any of Examples 41 to 44, wherein the averaging comprises moving averaging.

Example 46. The method according to any of Examples 41 to 45, wherein the pulse duration of the pulse-width-modulated signal is additionally pulse-code-modulated, further comprising pulse code demodulation of the pulse-width-modulated signal.

Although specific exemplary embodiments have been illustrated and described in this description, persons who have customary expert knowledge will recognize that a multiplicity of alternative and/or equivalent implementations can be chosen as substitution for the specific exemplary embodiments shown and described in this description, without departing from the scope of the invention shown. The intention is for this application to cover all adaptations or variations of the specific exemplary embodiments discussed here. Therefore, the intention is for this invention to be restricted only by the claims and the equivalents of the claims.

What is claimed is:

1. A device, comprising:
a sensor configured to output an analog sensor signal;
an analog-to-digital converter circuit configured to convert the analog sensor signal into a first digital signal having a bit width of n bits, wherein the first digital signal is a sigma-delta-modulated signal and n is equal to or greater than one; and
a pulse width modulator configured to generate a pulse-width-modulated signal based on the first digital signal,
wherein the analog-to-digital converter circuit comprises:
an analog-to-digital converter configured to convert the analog sensor signal into a second digital signal having a bit width of m bits, wherein m is an integer greater than one; and
a digital sigma-delta modulator configured to generate the first digital signal having the bit width of n bits where n<m based on the second digital signal.

2. The device as claimed in claim 1, wherein m-n is between 2 and 12.

3. The device as claimed in claim 1, wherein the analog-to-digital converter comprises a low-pass filter at its output in order to increase the bit width of the second digital signal from a previous bit width to m.

4. The device as claimed in claim 1, further comprising:
an interface configured to output the pulse-width-modulated signal; and
an analog low-pass filter coupled to an output of the interface.

5. A device, comprising:
a sensor configured to output an analog sensor signal;
an analog-to-digital converter circuit configured to convert the analog sensor signal into a first digital signal having a bit width of n bits, wherein the first digital signal is a sigma-delta-modulated signal and n is equal to or greater than one;
a pulse width modulator configured to generate a pulse-width-modulated signal based on the first digital signal; and
a further sensor configured to output a further sensor signal, wherein the pulse width modulator is configured to modulate the pulse-width-modulated signal based on the further sensor signal as a pulse code.

6. A device, comprising:
a sensor configured to output an analog sensor signal;
an analog-to-digital converter circuit configured to convert the analog sensor signal into a first digital signal having a bit width of n bits, wherein the first digital signal is a sigma-delta-modulated signal and n is equal to or greater than one; and
a pulse width modulator configured to generate a pulse-width-modulated signal based on the first digital signal,
wherein the pulse width modulator is configured to generate the pulse-width-modulated signal with pulse durations in a first range based on the first digital signal, and to generate the pulse-width-modulated signal with pulse durations in a second range, which is different than the first range, based on further information.

7. A device, comprising:
a sensor configured to output an analog sensor signal;
an analog-to-digital converter circuit configured to convert the analog sensor signal into a first digital signal having a bit width of n bits, wherein the first digital signal is a sigma-delta-modulated signal and n is equal to or greater than one; and
a pulse width modulator configured to generate a pulse-width-modulated signal based on the first digital signal,
wherein the analog-to-digital converter circuit has a chopper circuit, which is configured to operate with a chopper frequency, wherein a cycle of the pulse-width-modulated signal contains an integral number of periods of the chopper frequency.

8. A controller, comprising:
an input configured to receive a pulse-width-modulated signal from a sensor device; and
a processing circuit configured to generate a first digital reception signal based on averaging over k cycles of the pulse-width-modulated signal, where k is greater than or equal to 2.

9. The controller as claimed in claim 8, wherein the processing circuit is further configured to generate signal values of a second digital reception signal, wherein each signal value of the second digital reception signal is generated based on p cycles of the pulse-width-modulated signal, wherein p is less than k.

10. The controller as claimed in claim 9, wherein p is equal to 1.

11. The controller as claimed in claim 9, wherein k is greater than or equal to 4.

12. The controller as claimed in claim 8, wherein the averaging comprises moving averaging.

13. The controller as claimed in claim 8, wherein the processing circuit is configured to obtain pulse-code-modulated information from a modulated pulse duration of the pulse-width-modulated signal.

14. A method, comprising:
generating a first digital signal having a bit width of n bits based on an analog sensor signal, wherein the first digital signal is a sigma-delta-modulated signal and n is equal to or greater than one; and
generating a pulse-width-modulated signal based on the first digital signal,
wherein generating the first digital signal comprises converting the analog sensor signal into a second digital signal having a bit width of m bits, wherein m is an integer greater than one, and performing a digital sigma-delta modulation of the second digital signal in order to generate the first digital signal having the bit width of n bits where n<m.

15. The method as claimed in claim 14, further comprising:
performing pulse code modulation of a pulse duration of the pulse-width-modulated signal based on a further sensor signal.

16. The method as claimed in claim 14, wherein the pulse-width-modulated signal is generated with pulse durations in a first range based on the first digital signal, and wherein the pulse-width-modulated signal is generated with pulse durations in a second range, which is different than the first range, based on further information.

17. The method as claimed in claim 14, wherein generating the first digital signal comprises chopping with a chopper frequency, wherein a cycle of the pulse-width-modulated signal contains an integral number of periods of the chopper frequency.

18. A method, comprising:
receiving from a sensor device a pulse-width-modulated signal generated based on a sigma-delta-modulated signal; and
generating a first digital signal based on averaging over k cycles of the pulse-width-modulated signal, where k is greater than or equal to 2.

19. The method as claimed in claim 18, further comprising:
generating signal values of a second digital signal, wherein each signal value of the second digital signal is generated based on p cycles of the pulse-width-modulated signal, wherein p is less than k.

20. The method as claimed in claim 18, wherein a pulse duration of the pulse-width-modulated signal is additionally pulse-code-modulated, the method further comprising:
performing pulse code demodulation of the pulse-width-modulated signal.

\* \* \* \* \*